United States Patent [19]

Elms et al.

[11] 4,282,576

[45] Aug. 4, 1981

[54] INDICATOR DIAGRAM BASED AC ELECTRIC ENERGY METER

[75] Inventors: Robert T. Elms, Monroeville; Leonard C. Vercellotti, Oakmont, both of Pa.

[73] Assignee: Westinghouse Electric Corp., Pittsburgh, Pa.

[21] Appl. No.: 119,686

[22] Filed: Feb. 8, 1980

Related U.S. Application Data

[63] Continuation of Ser. No. 41,446, May 22, 1979, abandoned.

[51] Int. Cl.$^3$ .............................................. G01R 21/06
[52] U.S. Cl. ..................................... 364/483; 324/142
[58] Field of Search ....................... 364/483, 480, 464; 324/141, 142, 140 R, 76 R, 76 A; 361/79

[56] References Cited

U.S. PATENT DOCUMENTS

| 3,760,273 | 9/1973 | Burkett et al. | 324/142 |
| 4,077,061 | 2/1978 | Johnston et al. | 364/483 |

Primary Examiner—Errol A. Krass
Assistant Examiner—Gary Chin
Attorney, Agent, or Firm—E. L. Pencoske

[57] ABSTRACT

A first input signal representative of the voltage component is integrated producing an integral signal. The integral signal is compared to fixed reference potentials. A second input signal representative of the current component is sampled when the instantaneous magnitude of the integral signal equals a reference potential. The sample value is digitized and the integrator is reset by variable width reset pulses. Successive sample values are accumulated producing totalized values representative of the time integral of the product of the current component and the time integral of the voltage component, or energy.

21 Claims, 9 Drawing Figures

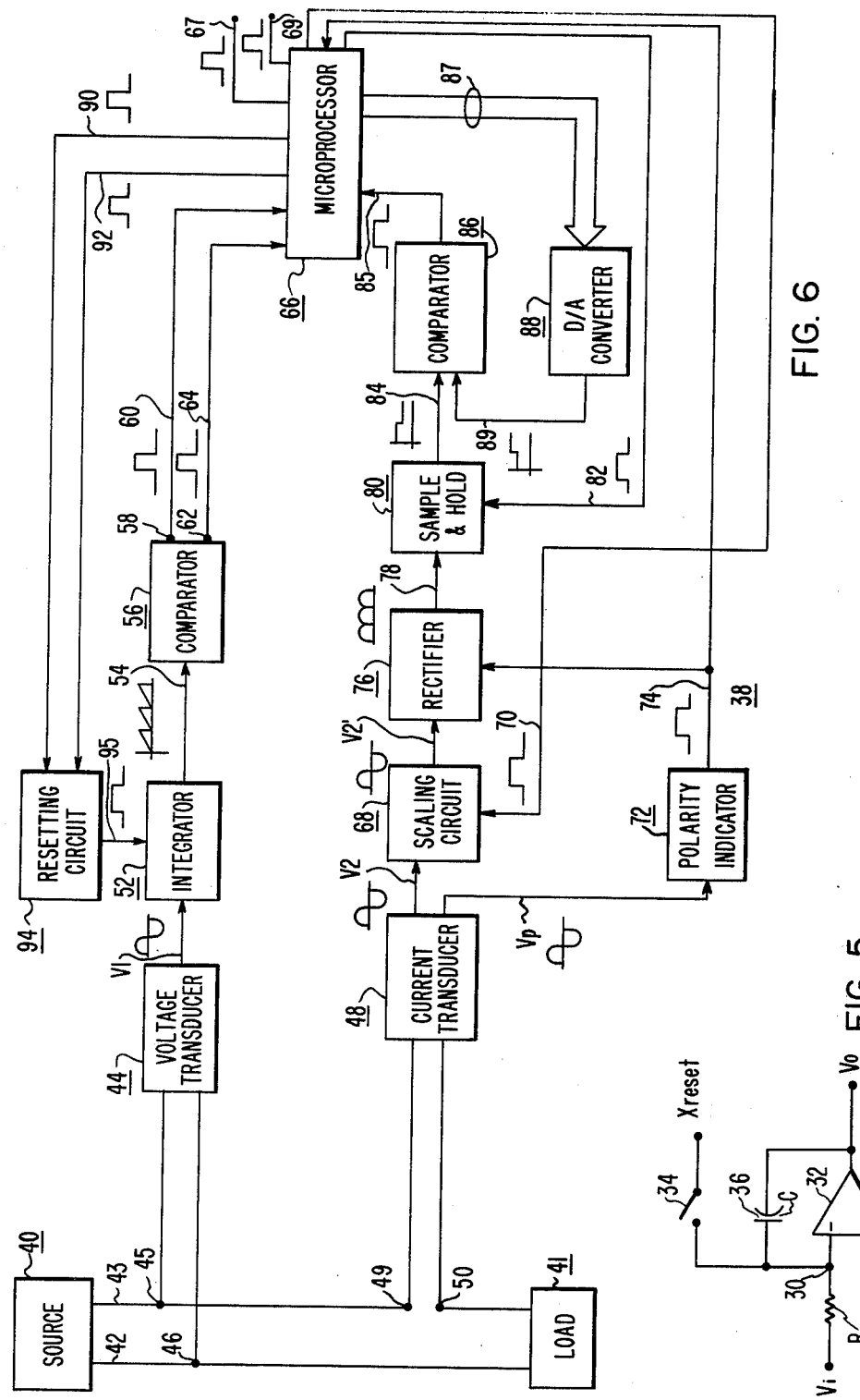

INDICATOR DIAGRAM BASED AC ELECTRIC ENERGY METER

This is a continuation of application Ser. No. 041,446, filed May 22, 1979, now abandoned.

BACKGROUND OF THE INVENTION

1. Field of the Invention

The present invention relates to electrical apparatus for measuring AC electrical energy quantities, and more specifically, to electrical apparatus implementing indicator diagram principles.

2. Description of the Prior Art

The electromechanical rotating disc type of watthour meter continues to enjoy almost exclusive use in electrical metering applications. However, other apparatus are being sought which will provide additional services, such as load control and time of day metering, on a cost competitive basis. This search has lead to the development of a multitude of apparatus capable of implementing a wide variety of techniques for determining AC electrical energy quantities.

One such technique for determining the value of an electrical energy quantity to be measured is a system based on a conventional analog multiplier circuit for computing the product of the current and voltage components. Such a system is disclosed in U.S. Pat. No. 3,864,631 and is assigned to the assignee of this invention.

A second technique, that is described in U.S. Pat. No. 3,764,908 and is assigned to the assignee of this invention, is for a semiconductor device having a logarithmic computing characteristic. Voltage and current related signals are input to the device which produces an output signal that is equal to the product of the input signals.

Another technique, known as time division multiplication, is illustrated by U.S. Pat. No. 3,794,917. Briefly, a signal proportional to the voltage on an electrical distribution system is sampled to derive a pulse width modulated output signal having a pulse duration proportional to the amplitude of the voltage signal. This signal controls a gating network which samples a current input signal at a rate proportional to the amplitude of the voltage signal. The resultant output signal is the product of the voltage and current and consists of a series of pulses having an amplitude proportional to the magnitude of the instantaneous current and a pulse width proportional to the magnitude of the voltage. After the product of the voltage and current signals is thus obtained, the resulting output signal is proportional to the average power consumed by the load. The output signal is then applied to a voltage to frequency converter which provides a pulse train wherein each pulse is proportional to the total energy consumed. The pulse train is used to drive mechanical counters, magnetic recorders, or electrical counting circuits and thereby provides an indication of the total electrical power consumed by a load.

It has been found that the analog electronic multiplying techniques are sometimes difficult to apply in order to obtain the desired accuracies. Accurate, driftfree analog multipliers and square root computing circuits are often expensive and difficult to obtain. Also, analog integration circuits required in the analog electronic power measuring apparatus produce undesired drift and variations over long time intervals. In time division multiplication circuits, it is known that frequency dependent sampling occurs with the associated digital integration also having a similar dependency upon variations of the integrating capacitors.

A further technique, digital processing, is illustrated by U.S. Pat. No. 4,077,061 and is assigned to the assignee of this invention. In this technique, the voltage and current signals are sampled at random intervals and converted into digital form. The digital signals are then processed by a digital computer which computes the instantaneous values of electrical energy quantities and accumulates the instantaneous values of the computed quantity over a predetermined time interval to provide a measurement of various electrical energy quantities.

Ideal digital measuring apparatus utilize analog to digital converters having very high speeds and high resolutions. However, these two characteristics are competing from a design standpoint since more time is needed in order to achieve the higher resolutions. The higher resolution results in binary words of greater lengths which require associated circuitry that is more complex and expensive. Further, complex digital processing circuits capable of operating at high speeds require larger and more expensive power supplies. Slower sampling speeds permit digital processing at lower speeds to simplify the digital processing circuitry. A reduction in resolution permits handling of shorter binary words for producing the digitized binary representations of the analog signal amplitudes. However, the reduced sampling rates and lower digitizing resolution have a corresponding reduction in the accuracy of the digital representations of the sample amplitudes and a reduction in the true digital representation of each complete cycle of the analog input signals.

A still further technique for determining the value of an electrical energy quantity to be measured is a system which determines the area of an indicator diagram. The area enclosed by an indicator diagram is proportional to the instantaneous power per cycle delivered to a load. The system disclosed in U.S. patent application Ser. No. 919,874 filed on June 26, 1978 and assigned to the assignee of this invention is an example of the indicator diagram technique. The area enclosed by the indicator diagram is determined by sampling a signal related to the current component whenever unit changes occur in the magnitude of the time integral of a signal related to the voltage component. This provides successive sample values of the signal related to the current component which are accumulated to provide an indication of the area enclosed by the indicator diagram. Further accumulation provides an indication of the energy consumed.

The present invention is an apparatus for implementing this last technique. More specifically, it is a system for computing the area enclosed by an indicator diagram.

SUMMARY OF THE INVENTION

This invention discloses a system for determining the value of an electric energy quantity delivered to a load by computing the area enclosed by an indicator diagram. A first input signal representative of the voltage component is applied to an integrator producing an integral signal. The integral signal is compared to fixed and predetermined reference potentials. When the instantaneous magnitude of the integral signal equals the magnitude of one of the reference potentials, two events are initiated. First, a sample value of a second input signal representative of the current component is taken. Second, the integrator is reset by a constant current pulse having a predetermined and variable time duration. The sample values of the second input signal are digitized and accumulated producing totalized values representative of the time integral of the product of the current component times the time integral of the voltage component. Finally, output signals representative of the AC electric energy quantity are produced in response to the totalized values.

By sampling the second input signal at predetermined times which are a function of unit changes in the integral signal, and accumulating successive digital representations of the instantaneous magnitudes of the second input signal at each sampling time, the time integral of the product of the integral signal and the second input signal is effectively computed without the use of the analog multiplying techniques commonly employed in prior art meter apparatus. In addition, the product of the integral signal and the second input signal is effectively computed without multiplying digital representations of the input signals as is commonly done in meter apparatus utilizing digital processing and calculating techniques thereby allowing the use of simpler computing elements.

BRIEF DESCRIPTION OF THE DRAWINGS

FIG. 5 illustrates a circuit used for integration;

FIG. 6 is a block diagram of a meter apparatus built in accordance with the present invention;

DESCRIPTION OF THE PREFERRED EMBODIMENT

1. Fundamental Principles

To better understand the present invention and the operation thereof it is appropriate to first discuss two fundamental principles. The first, and broadest of the two principles, is the application of indicator diagrams to AC electrical power measurements. The use of indicator diagrams in the measurement of other types of power, such as the power in steam engines, internal combustion engines, air compressors, etc., is well known. Accordingly, the application of indicator diagrams to the measurement of AC electrical power is also known.

In an electrical power distribution system, the power delivered to a load is defined by a voltage component and a current component. The electrical analog of an indicator diagram is obtained by plotting the time integral of the voltage component versus the current component. The area enclosed by the resulting curve is proportional to the power per cycle (of the current component) delivered to the load. By determining this area once per cycle and then summing successive areas over a predetermined period of time, the energy consumed by the load can be determined.

Figure 1:
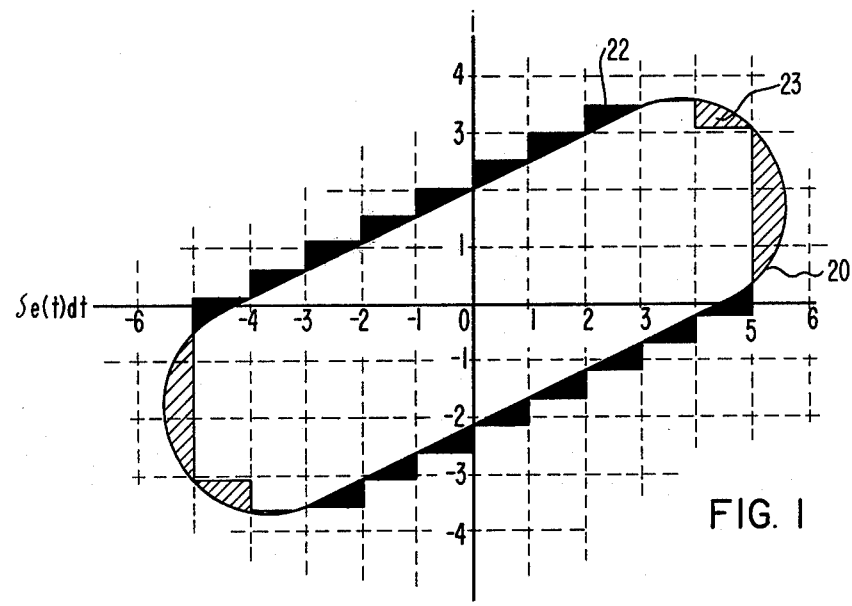
FIG. 1 illustrates an indicator diagram wherein the voltage and current components of an AC electric energy quantity have the same periods.

A simple example of an indicator diagram is shown in FIG. 1. FIG. 1 shows a closed curve 20 which is the result when the voltage component and the current component have the same period, an arbitrary phase relationship, and neither component is changing rapidly from cycle to cycle. The closed curve 20 is retraced one time for each cycle of the current component. To calculate the area enclosed by the curve 20 a grid composed of blocks having a known arbitrary area is superimposed onto the graph and the blocks enclosed by the closed curve 20 are counted.

In a meter apparatus, the area enclosed by the curve 20 is determined by monitoring the time integral of the voltage component. When the time integral of the voltage component equals a unit value (in volts) along the $\int e(t)dt$ axis the current component is sampled. For example, starting at zero, the magnitude of the time integral of the voltage component is monitored until the value of one unit is reached, at which time the current component is sampled. The area enclosed by the curve 20 up to this point in time is two and one half units (in amps) times one unit (in volts) or two and one half units squared (volt-amps). Similarly, when two is reached, another unit value along the $\int e(t)dt$ axis has been reached. The current component is sampled again this time providing a value of three units. Three units times one unit yields three units squared which is added to the previous value. At this point it is apparent that the meter apparatus need not multiply the two samples since all the $\int e(t)dt$ samples are one unit. Therefore, the apparatus need only add, or subtract, the sample values of the current component.

Error is introduced as shown by the shaded areas 22 and the cross-hatched areas 23 since the meter apparatus computes the area as if the current component was a constant value from one unit value along the $\int e(t)dt$ axis to the next unit value. The shaded areas 22 represent areas improperly added to the total area enclosed by the curve 20. The cross hatched areas 23 represent areas improperly subtracted from the total area enclosed by the curve 20. This error can be overcome and the accuracy increased by using a grid system composed of smaller blocks. In terms of the electrical apparatus, this translates into smaller unit values for the time integral of the voltage component and more samples of the current component.

Figure 2:
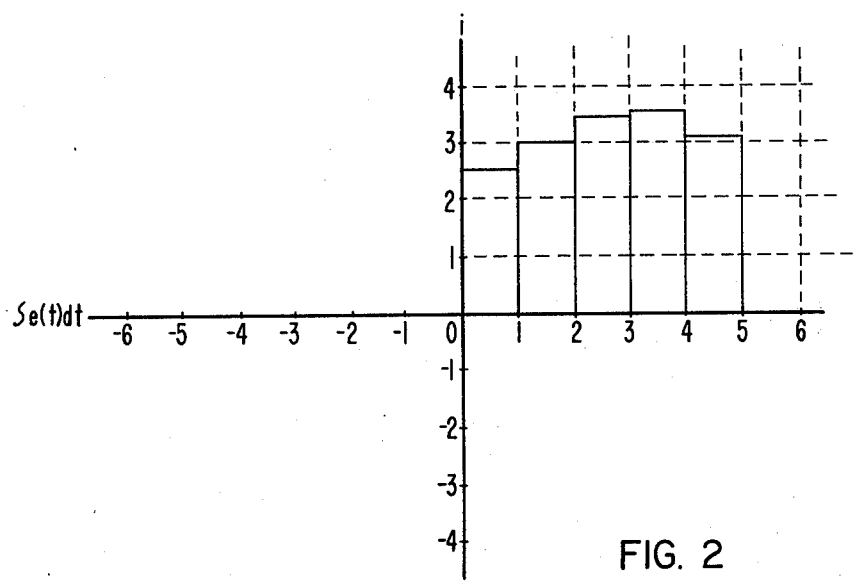
FIGS. 2, 3 and 4 illustrate the sample values produced by a meter apparatus to approximate the area enclosed by the indicator diagram.
Figure 3:
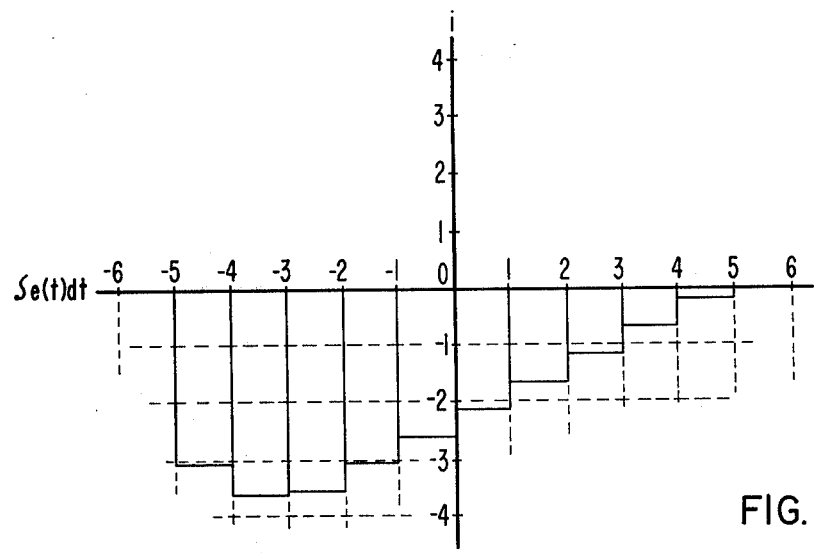
Figure 4:
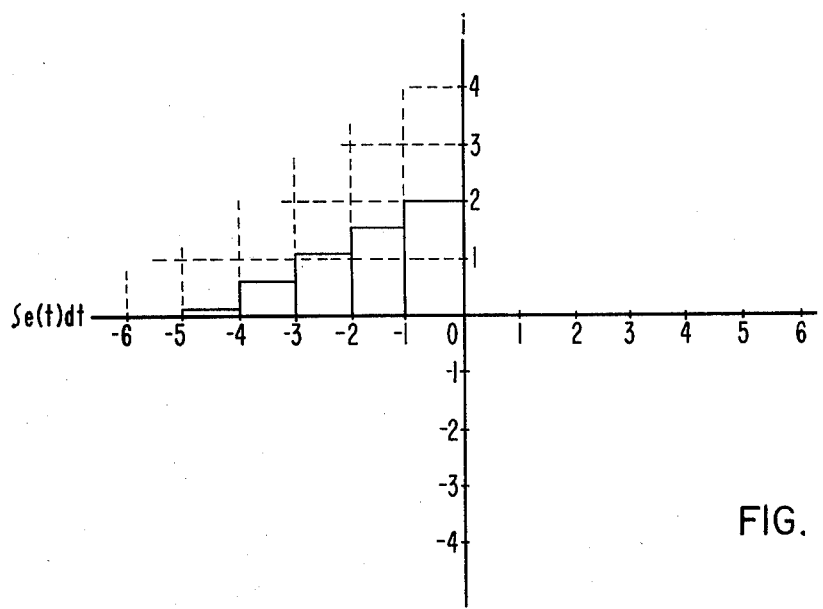

If the time integral of the voltage component is increasing when a sample of the current component is taken, that sample of the current component is added to the previous total. Conversely, if the time integral of the voltage component is decreasing when the sample of the current component is taken, that sample of the current component is subtracted from the total. The additions and subtractions of the samples of the current component that will result from the grid system of FIG. 1 are shown in FIGS. 2, 3, and 4. FIG. 2 shows the addition of the samples of the current component as the time integral of the voltage component goes from a value of zero to a value of five. FIG. 3 shows the subtractions of the samples of the current component as the time integral of the voltage component goes from a value of five to a value of minus five. All the sample values of the current component are negative, and the subtraction of a minus value results in addition. Therefore, these sample values of the current component are added to the total. Finally, FIG. 4 shows the additions of the sample values of the current component as the time integral of the voltage component goes from minus five to zero. These sample values of the current component are all positive and are therefore added to the previous total. The sum of the sample values of the current component shown in FIGS. 2, 3 and 4 is an approximation of the total area enclosed by the curve 20 which is the power for one period of the current component. In this manner, the electrical apparatus can, by successive additions, determine the energy delivered to the load by the power distribution system. This concludes the discussion of the first principle.

The second and more narrow principle is the application of a current pulse in place of a reference voltage for the resetting of an integrator. In the present invention an integrator is used to determine when a unit value along the $\int e(t)dt$ axis has been reached. It is then necessary to reset the integrator to facilitate the detection of the next unit value. Both current and voltage reset are well known in the art. In FIG. 5 a typical operational amplifier circuit 28 used for integration is shown.

Assuming the input impedance of the operational amplifier 32 to be infinite the current equation for the node 30 is;

$$(Vi - V)/R = C\, d/dt\,(V - Vo) \tag{1}$$

where

Vi = analog input voltage
R = resistance
C = capacitance
d/dt = derivative with respect to time
V = voltage at node 30
Vo = analog output voltage.

The output voltage, Vo, is the voltage, V, at node 30 times the gain, K, of the operational amplifier 32. Or, $$V = Vo/K \tag{2}$$

Assuming K is infinite the voltage, V, at node 30 will be zero for all practical purposes. Setting V equal to zero in equation (1) yields, $$Vi/R = C\, d/dt\,(-Vo) \tag{3}$$

Integrating both sides of equation (3) and solving for Vo, $$Vo = (-1/RC) \int Vi\, dt \tag{4}$$

Equation (4) illustrates the fact that the output voltage Vo of the operational amplifier circuit 28 is proportional to the time integral of the input voltage Vi.

One method of resetting the operational amplifier circuit 28 is implemented by setting Xreset equal to a reference voltage Vref. The output voltage Vo increases until it equals a unit voltage along the $\int e(t)dt$ axis. At this time, the switch 34 is closed connecting the capacitor 36 to Vref. In order for Vref to reset the capacitor 36 to a value of zero Vref must be of equal magnitude and opposite polarity of the value Vo to which the capacitor 36 has already been charged. Therefore, $$Vo = -Vref \tag{5}$$

Substituting equation (5) into equation (4), $$-Vref = (-1/RC) \int Vi\, dt$$

or $$RC * Vref = \int Vi\, dt \tag{6}$$

Equation (6) illustrates that when a voltage, Vref, is used to reset the operational amplifier circuit 28, the reset operation is dependent on the value, C, of the capacitor 36. Over long time periods, the value, C, will vary. Since Vref is constant the capacitor 36 will be reset to the same voltage level. The circuit 28 will then integrate starting from the same voltage level but this time, since the value, C, of the capacitor 36 has shifted the circuit 28 will integrate faster (or slower depending on the direction of the shift in the value C). This introduces error in the determination of when a unit value along the $\int e(t)dt$ axis has been reached which ultimately results in errors in computing the energy consumed by the load.

A second method of resetting the operational amplifier circuit 28 is implemented by setting Xreset equal to a reset current Ireset. Since the current, Ireset, is equal to charge, q, per unit time, $\Delta t$, charge is equal to, $$q = Ireset * \Delta t \tag{7}$$

Capacitance, C, may be defined as, $$C = q/v \tag{8}$$

where q = charge
v = voltage level to which the capacitor may be charged.

Substituting equation (7) into equation (8) and solving for v, $$v = (Ireset * \Delta t)/C \tag{9}$$

As in voltage reset, the switch 34 is closed when the output voltage Vo equals a unit value along the $\int e(t)dt$ axis. In order for Ireset to reset the capacitor 36 to a value of zero, the voltage v, to which the capacitor 36 charges because of Ireset, must be of equal magnitude and opposite polarity of the value Vo to which the capacitor has already been charged. Therefore, $$Vo = -v = -(Ireset * \Delta t)/C \tag{10}$$

Substituting equation (10) into equation (4), $$-(Ireset * \Delta t)/C = (-1/RC) \int Vi\, dt$$

or $$R * Ireset * \Delta t = \int Vi\, dt \tag{11}$$

Equation (11) illustrates that when a current, Ireset, is used to reset the operational amplifier circuit 28, the reset operation is independent of the value, C, of the capacitor 36. Over long time periods the value, C, will vary, but the capacitor 36 will be reset to an appropriate voltage level. Because of the shift in value of the reset voltage the shift in the value, C, is compensated. If the shift in value of the capacitor 36 causes the circuit 28 to integrate faster, the capacitor 36 will be reset to a lower voltage. Similarly, if the shift in value causes the circuit 28 to integrate slower, the capacitor 36 will be reset to a higher voltage. Because of this self compensation errors due to the drifting of the value, C, of the capacitor 36 are minimized. For this reason, the present invention utilizes current reset rather than voltage reset. This concludes the discussion of the second principle.

The use of indicator diagrams for the measurement of AC electrical power and the use of a current pulse to reset an integrator are the two major principles fundamental to the present invention. The hardware for the implementation of these two principles and the operation of the hardware is described hereinafter in both sections 2 and 3 of this description of the preferred embodiment. 2. Brief Description and Operation of the Meter Apparatus FIG. 6 is a block diagram illustrating a meter apparatus 38 constructed in accordance with the present invention. A source 40 is connected to a load 41 by a pair of conductors 42 and 43. A voltage transducer 44 is connected across the conductors 42 and 43 at input terminals 45 and 46. The voltage transducer 44 produces a first input signal V1 representative of a voltage component of an AC electric energy quantity delivered by the source 40 to the load 41. A current transducer 48 is connected in series with the conductor 43 at input terminals 49 and 50. The current transducer 48 produces a second input signal V2 representative of the current component of the AC electric energy quantity. The current transducer 48 also produces an analog signal Vp representative of the polarity of the current component.

The first input signal V1 is the input to an integrator 52. The integrator 52 produces an integral signal 54 that is the input to a comparator 56. The comparator 56 produces at an output terminal 58 a pulse 60 when the instantaneous magnitude of the integral signal 54 equals the magnitude of a fixed and predetermined high reference potential. The comparator 56 also produces at an output terminal 62 a pulse 64 when the instantaneous magnitude of the integral signal 54 equals a fixed and predetermined low reference potential. The output terminals 58 and 62 of the comparator 56 are connected to a microprocessor 66. The microprocessor 66 produces a scaling control signal 70, a sample control signal 82, a first reset signal 90, and a second reset signal 92. The microprocessor 66 controls the operation of the meter apparatus 38 and will be discussed further hereinbelow.

Starting at the current transducer 48, the analog signal Vp is the input to a polarity indicator 72. The polarity indicator 72 produces a polarity signal 74 that is input to the microprocessor 66. The second input signal V2 is the input to a scaling circuit 68. The scaling circuit 68 produces, in response to the scaling control signal 70, a signal V2' that is directly proportional to the second input signal V2. The signal V2' is the input to a rectifier 76. The rectifier 76 produces, in response to the polarity signal 74 a rectified signal 78 that is the input to a sample and hold circuit 80. The sample and hold circuit 80 produces, in response to the sample control signal 82 a sample value 84 of the rectified signal 78.

The sample value 84 is input to the microprocessor 66 by the combination of a comparator 86 and a digital to analog converter 88. The digital to analog converter 88 provides a feedback path between the microprocessor 66 and the comparator 86. The sample value stored in the microprocessor 66 is input to the analog to digital converter 88 by conductors 87. The analog to digital converter 88 produces an analog counterpart signal 89 of the sample value stored in the microprocessor 66. The analog counterpart signal 89 is compared by the comparator 86 to the sample value 84 produced by the sample and hold circuit 80. The comparator 86 produces an update signal 85 in response to the comparison. The sample value stored in the microprocessor 66 is then updated by the update signal 85 until it equals the sample value 84 produced by the sample and hold circuit 80. By this process, the sample value 84 is input to the microprocessor 66.

In operation, the meter apparatus 38 shown in FIG. 6 computes the area enclosed by an indicator diagram. The integrator 52 continuously integrates the first input signal V1 producing the integral signal 54. The integral signal 54 represents the $\int e(t)dt$ axis. The comparator 56 monitors the integral signal 54 in order to determine if a unit value along the $\int e(t)dt$ axis has been reached. When a unit value has been reached in the positive direction an output pulse 60 is produced at the output terminal 58. Similarly, when a unit value has been reached going in the negative direction an output pulse 64 is produced at the output terminal 62. The microprocessor 66 produces the first reset signal 90 in response to the pulses produced at the output terminal 58 of the comparator 56 and produces the second reset signal 92 in response to the pulses produced at the output terminal 62 of the comparator 56. The production of the first reset signal 90 and the second reset signal 92 is an important feature of the present invention. The first reset signal 90 is composed of variable width pulses, one pulse for each pulse 60 produced at the output terminal 58. The second reset signal 92 is also composed of variable width pulses, one pulse for each pulse 64 produced at the output terminal 62. The first reset signal 90 and the second reset signal 92 control a resetting circuit 94. The resetting circuit 94 produces, in response to the width of the pulses of the first and second reset signals 90 and 92, respectively, a reset current 95. The reset current 95 resets the integrator 52 thus returning the integral signal 54 to its initial condition. With the integral signal 54 returned to its initial condition the comparator 56 is prepared to detect the next unit value along the $\int e(t)dt$ axis thus eliminating the need for changing the high and low reference potentials.

The sequential operation of the meter apparatus 38 is as follows. The comparator 56 produces a pulse when a unit value along the $\int e(t)dt$ axis has been reached. If the unit value is positive, the first reset signal 90 resets the integrator 52. If the unit value is negative, the second reset signal 92 resets the integrator 52. Irrespective of whether the unit value is positive or negative, the microprocessor 66 commands, via the sample control signal 82, the sample and hold circuit 80 to produce a sample value 84. The sample value 84 is input to the microprocessor 66 by the combination of the comparator 86 and the digital to analog converter 88. The microprocessor 66 digitizes the sample value 84 producing a digital number. The scaling control signal 70 is examined by the microprocessor 66 to determine the scaling factor. The digital number is modified to account for the scaling factor used by the scaling circuit 68. If the modified digital number is less than a predetermined value, the scaling factor is increased by the scaling control signal 70 so that the next sample value 84 will be a larger value and thus easier for the mircroprocessor 66 to convert to a digital number.

Once the modified digital number has been determined, the next step is to determine the polarity of the current component by examining the polarity signal 74. The microprocessor then determines whether the modified digital number is to be added to or subtracted from a totalized value stored in the microprocessor 66 depending upon the polarity of the current component and the sign of the unit value along the ∫e(t)dt axis. The totalized value is the sum of all the previous samples values. The totalized value is representative of the time integral of the product of the current component times the time integral of the voltage component, or energy. After the microprocessor has performed the appropriate operation (addition/subtraction) the totalized value is compared to a digital number representing a positive/negative energy quantity. If the totalized value is greater/less than the digital number representing the positive/negative energy quantity, the microprocessor produces an appropriate output pulse 67/69 representative of the positive/negative energy quantity. The digital number representing the positive/negative energy quantity is then subtracted from the totalized value. The microprocessor then returns to the initial step of waiting for the comparator 56 to produce a pulse when a unit value along the ∫e(t)dt axis has been reached.

A more detailed description of both the hardware implementing the present invention and the operation of the hardware is presented in conjunction with FIGS. 7 and 8 hereinafter in Section 3 of this description of the preferred embodiment.

3. Detailed Description and Operation of the Meter Apparatus

Figure 7:
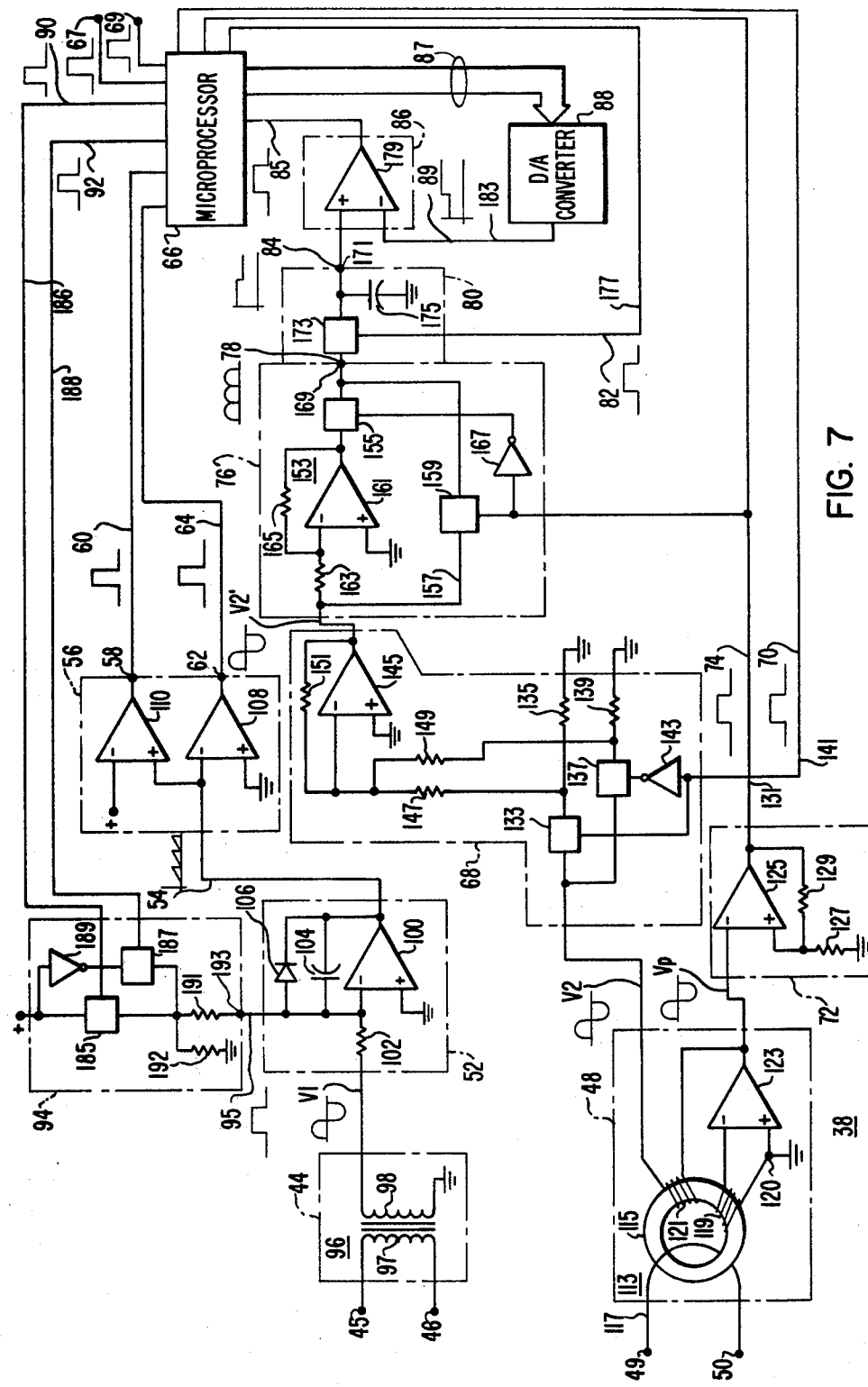
FIG. 7 is an electrical schematic of a meter apparatus built in accordance with the present invention.

A detailed schematic diagram of the meter apparatus 38 is shown in FIG. 7. Beginning at the voltage input terminals 45 and 46, the voltage component of the AC electrical energy quantity to be measured is applied across a primary winding 97 of a voltage transformer 96. The voltage transformer 96 is the voltage transducer 44 shown in FIG. 6. The secondary winding 98 of the voltage transformer 96 is connected at one end to ground. The other end of the secondary winding 98 is connected to the inverting input terminal of an operational amplifier 100 through a resistor 102. The non-inverting input terminal of the operational amplifier 100 is connected to ground. The output terminal of the operational amplifier 100 is connected to the inverting input terminal of the operational amplifier 100 through the parallel combination of a capacitor 104 and a diode 106. The cathode of the diode 106 is connected to the output terminal of the operational amplifier 100. The combination of the operational amplifier 100, the resistor 102, the capacitor 104, and the diode 106 comprises the integrator 52.

The comparator 56 is comprised of a first operational amplifier 110 and a second operational amplifier 108. The output terminal of the operational amplifier 100 is connected to both the inverting input terminal of the operational amplifier 108 and the non-inverting input terminal of the operational amplifier 110. The non-inverting input terminal of the operational amplifier 108 is connected to ground and the inverting input terminal of the operational amplifier 110 is connected to a fixed and predetermined positive voltage source. The output terminal of the operational amplifier 108 is connected to the output terminal 62 of the comparator 56. The output terminal of the operational amplifier 110 is connected to the output terminal 58 of the comparator 56. The output terminals 58 and 56 are connected to the microprocessor 66.

Turning now to the current input terminals 49 and 50, the current transducer 48 is a compensated current transformer arrangement 113 of the type described in U.S. patent application Ser. No. 923,620 and assigned to the assignee of the present invention. The compensated current transformer arrangement 113 has a transformer core 115, a single turn primary winding 117, a first and sensing secondary winding 119, a second and compensating secondary winding 121, and an operational amplifier 123. The single turn primary winding 117 is connected in series with the current input terminals 49 and 50. The first and sensing secondary winding 119 is connected at a node 120 to ground and is connected to the inverting input terminal of the operational amplifier 123. The non-inverting input terminal of the operational amplifier 123 is connected to ground. At the output terminal of the operational amplifier 123 the analog signal Vp is available. The analog signal Vp is input to the second and compensating secondary winding 121. The output of the second and compensating secondary winding 121 is the second input signal V2.

The polarity indicator 72 is comprised of an operational amplifier 125 receiving at its inverting input terminal the analog signal Vp. The non-inverting input terminal of the operational amplifier 125 is connected to ground through a resistor 127 and is connected to its output terminal through a resistor 129. The output terminal of the operational amplifier 125 is connected to the microprocessor 66 by a conductor 131. The conductor 131 carries the polarity signal 74.

The scaling circuit 68 is comprised of a first current path electrically in parallel with a second current path. The first current path has a switch 133 connected to ground through a resistor 135. The second current path has a switch 137 connected to ground through a resistor 139. The resistance value of the resistor 135 is eight times greater than the resistance value of the resistor 139. The second input signal V2 is input to each of the two switches 133 and 137. The switch 133 is connected to the microprocessor 66 by a conductor 141. The switch 137 is connected to the microprocessor 66 through the conductor 141 and an inverter 143. The conductor 141 carries the scaling control signal 70. The voltage developed across the resistor 135 is input to the inverting input terminal of an operational amplifier 145 through a resistor 147. Similarly, the voltage developed across the resistor 139 is input to the inverting input terminal of the operational amplifier 145 through a resistor 149. The non-inverting input terminal of the operational amplifier 145 is connected to ground. The output terminal of the operational amplifier 145 is connected to its inverting input terminal through a resistor 151. The analog signal V2′ is available at the output terminal of the operational amplifier 145.

The rectifier 76 is comprised of a rectifying circuit 153 in series with a switch 155, and a bypass conductor 157 having a switch 159. The rectifying circuit 153 has an operational amplifier 161 receiving at its inverting input terminal the signal V2′ through a resistor 163. The non-inverting input terminal of the operational amplifier 161 is connected to ground. The output terminal of the operational amplifier 161 is connected to its inverting input terminal through a resistor 165. The output terminal of the operational amplifier 161 is also connected to an output terminal 169 of the rectifier 76 through the switch 155. The bypass conductor 157 carries the signal V2′ to the output terminal 169 through the switch 159. The switch 159 receives the polarity signal 74 from the conductor 131. The switch 155 is connected to the conductor 131 through an inverter 167. The rectified signal 78 is available at the output terminal 169.

The sample and hold circuit 80 has a switch 173 connecting the output terminal 169 of the rectifier 76 to an output terminal 171 of the sample and hold circuit 80. The switch 173 receives the sample control signal 82 from a conductor 177. The output terminal 171 is connected to ground through a capacitor 175. The sample value 84 is available at the output terminal 171.

The sample value 84 is input to the microprocessor 66 by the combination of the comparator 86 and the digital to analog converter 88. The comparator 86 is an operational amplifier 179 which receives at its non-inverting input terminal the sample value 84. The output terminal of the operational amplifier 179 is connected to the microprocessor 66 by a conductor 181 which carries the update signal 85. The microprocessor 66 is connected to the digital to analog converter 88 by the conductors 87 which carry the sample value stored in the microprocessor 66. The output terminal of the digital to analog converter 88 is connected to the inverting input terminal of the operational amplifier 179 by the conductor 183. The conductor 183 carries the analog counterpart signal 89.

The remaining portion of the circuit shown in FIG. 7 is the resetting circuit 94. The resetting circuit 94 has a first switch 185 electrically in parallel with the series combination of an inverter 189 and a second switch 187. The first switch 185 is controlled by the first reset signal 90 which is delivered by a conductor 186 from the microprocessor 66. The second switch 187 is controlled by the second reset signal 92 which is delivered by a conductor 188 from the microprocessor 66. The parallel combination of the first switch 185 with the second switch 187 is connected at one end to a positive voltage source. The other end of the parallel combination is connected to an output terminal 193 through a resistor 191, and is connected to ground through a resistor 192. The reset current 95 is available at the output terminal 193. The output terminal 193 is connected to the inverting input terminal of the operational amplifier 100. This concludes the description of the hardware of the meter apparatus 38 shown in FIG. 7.

Figure 9:
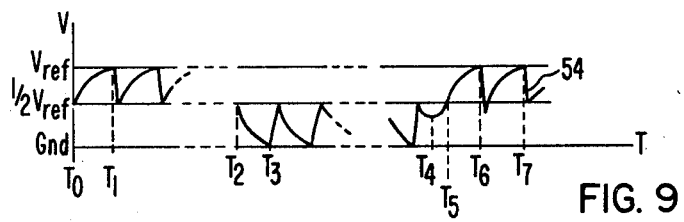
FIG. 9 illustrates the plot of an output signal of an integrator versus time.
Figure 8:
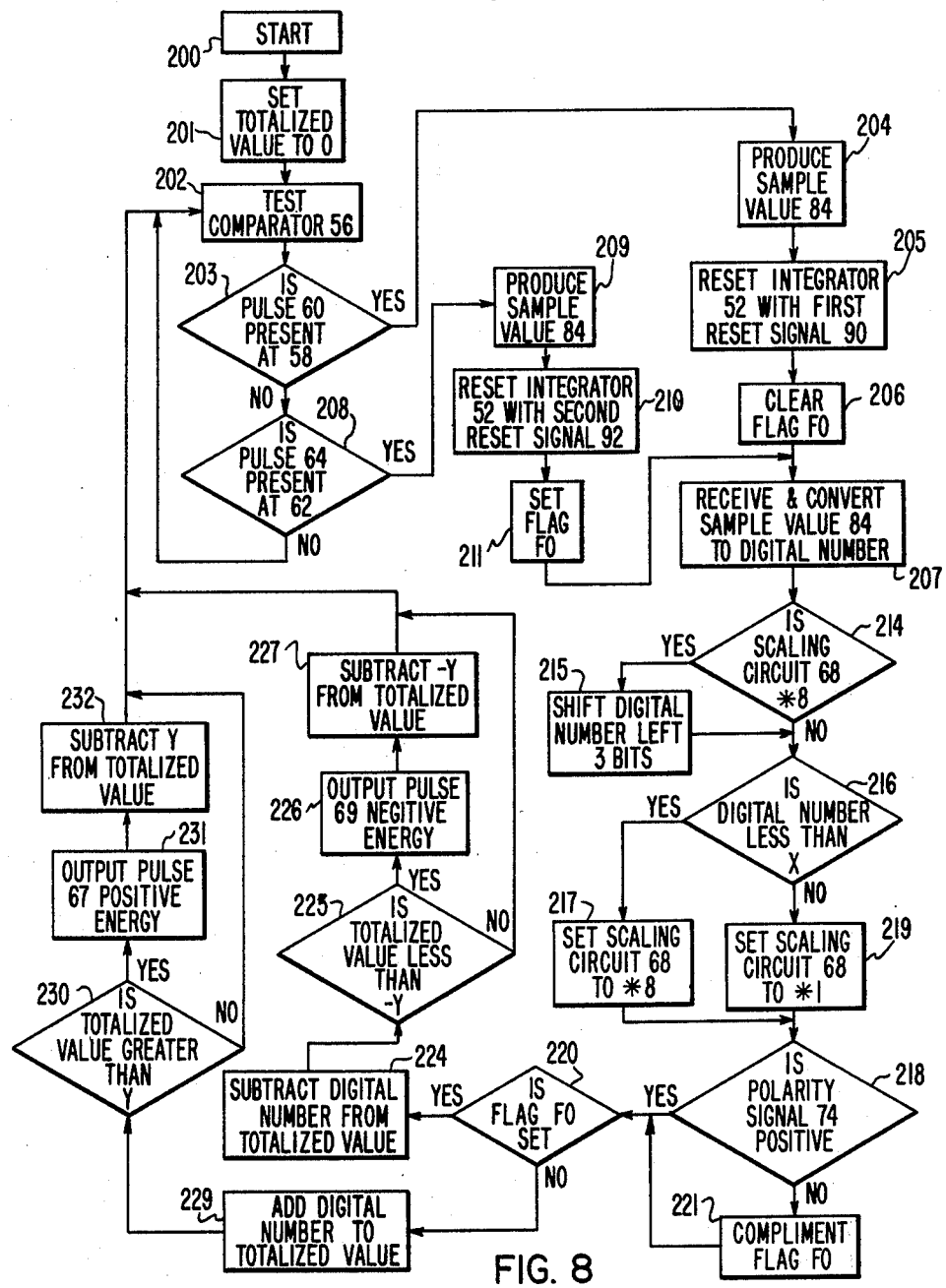
FIG. 8 is a flowchart outlining the operation of the present invention.

The operation of the meter apparatus 38 shown in FIG. 7 may be more easily understood by referring to the flow chart shown in FIG. 8. FIG. 8 outlines the sequence of operations carried out by the meter apparatus 38 in determining the area enclosed by the indicator diagram. The program begins at block 200. The first step 201 is to set the totalized value stored in the microprocessor 66 to zero. The next step 202 is to test the comparator 56. At step 203, the microprocessor 66 interrogates the output terminal 58 of the comparator 56 to determine if the output pulse 60 is present. Referring briefly to FIG. 9 wherein the integral signal 54 is plotted versus time, an output pulse 60 will be present when the instantaneous magnitude of the integral signal 54 equals, at T1, the magnitude of the fixed positive reference potential. The reference potential is equal to twice the value of a unit value along the $\int e(t)dt$ axis. When the output pulse 60 is present this indicates that a unit value along the $\int e(t)dt$ axis in the positive direction has been reached and the microprocessor 66 proceeds to step 204 of FIG. 8.

At step 204 the microprocessor 66 uses the sample control signal 82 delivered by the conductor 177 to momentarily close the switch 173. When the switch 173 is closed the capacitor 175 charges up producing the sample value 84. Following the production of the sample value 84 at step 204 the microprocessor 66 resets the integrator 52 at step 205. This is accomplished by the first reset signal 90 delivered to the switch 185 by the conductor 186. The switch 185 is closed in response to the width of the pulses of the first reset signal 90. At step 206 the microprocessor internally clears a flag F0.

The steps 204, 205 and 206 are carried out only if the decision step 203 is answered affirmatively. If the decision step 203 is answered in the negative, the microprocessor 66 proceeds to step 208. The step 208 is a decision step which interrogates the output terminal 62 of the comparator 56 to determine if the pulse 64 is present. Referring briefly to FIG. 9, an output pulse 64 will be present when the instantaneous magnitude of the integral signal 54 equals, at T3, ground potential. If the pulse 64 is not present, the microprocessor returns to step 202 of FIG. 8. When the pulse 64 is present, this indicates that a unit value along the $\int e(t)dt$ axis in the negative direction has been reached and the microprocessor 66 proceeds to step 209.

At step 209 the microprocessor 66 uses the sample control signal 82 delivered by the conductor 177 to momentarily close the switch 173 thus producing the sample value 84. Following the production of the sample value 84 at the step 209 the microprocessor 66 resets the integrator 52 at step 210. This is accomplished by the second reset signal 92 delivered to the switch 187 by the conductor 188. The switch 187 is closed in response to the width of the pulses of the second reset signal 92. At step 211 the microprocessor 66 internally sets the flag F0.

From either step 206 or step 211 the microprocessor 66 proceeds to step 207. At step 207 the sample value 84 is received by the microprocessor which then produces a digital number responsive to the sample value 84. The sample value 84 is input to the microprocessor 66 by the combination of the comparator 86 and the digital to analog converter 88 using the technique of successive approximations. For example, the first time a sample value 84 is produced, all the bits of the digital number stored in the microprocessor 66 are zero. The most significant bit of the digital number is applied to the digital to analog converter 88 by the conductors 87. The digital to analog converter 88 produces the analog counterpart signal 89 of the most significant bit of the digital number. This analog counterpart signal 89 is then compared by the comparator 86 to the sample value 84 produced by the sample and hold circuit 80. The comparator 86 produces the update signal 85 to instruct the microprocessor that the first significant bit of the digital number is either greater than or less than the sample value 84. The microprocessor then updates the most significant bit of the digital number accordingly. The microprocessor 66 then applies the first two most significant bits to the digital to analog converter 88. The digital to analog converter 88 produces the analog counterpart signal 89 of the first two most significant bits of the digital number. This analog counterpart signal 89 is then compared to the sample value 84 by the comparator 86 which again produces the update signal 85. The microprocessor 66 uses the update signal 85 to update the second most significant bit of the digital number. The microprocessor repeats this process for the three most significant bits, four most significant bits, etc., until the digital number stored in the microprocessor equals the sample value 84 produced by the sample and hold circuit 80. When the sample and hold circuit 80 produces a new sample value 84, the microprocessor 66 repeats the entire process of successive approximations until the digital number then stored in the microprocessor again equals the sample value 84.

Once the sample value 84 has been input to the microprocessor 66, the microprocessor proceeds to the decision step 214. The microprocessor 66 examines the scaling control signal 70 to determine which of the two switches, 133 or 137, is in the closed position thereby determining the scaling factor. If the switch 133 is closed, the microprocessor proceeds to step 215 wherein the digital number is shifted to the left by three bits to compensate for the scaling factor. From step 215, the microprocessor proceeds to step 216. If, however, at the decision step 214, the switch 137 was closed, a scaling factor of 1 is being used by the scaling circuit 68 and the microprocessor therefore proceeds directly to the step 216.

At step 216, the digital number is compared to a constant digital number X stored in the microprocessor 66. If the digital number is less than X, the microprocessor, at step 217, opens switch 137 and closes switch 133 in order that the scaling factor of 8 may be used. By using the larger scaling factor the next sample value 84 will be increased making it easier to more accurately represent the sample value 84 by the digital number. From step 217, the microprocessor then moves to step 218. However, if at step 216, the digital number is not less than X, the microprocessor 66 opens switch 133 and closes switch 137 to set the scaling factor to 1. This is accomplished at step 219 from which the microprocessor then proceeds to step 218.

At step 218, the microprocessor 66 examines the polarity signal 74 to determine if the sample value 84 is positive If the sample value 84 is not positive, the flag F0 is complemented at step 221. The microprocessor 66 then proceeds to step 220. If the polarity signal 74 is determined to be positive at step 218, the microprocessor proceeds directly to step 220. At the decision step 220, the microprocessor internally checks to see if the flag F0 is set. If the flag F0 is set, the microprocessor subtracts the digital number from the totalized value at step 224. If the flag F0 is not set, the microprocessor adds the digital number to the totalized value at step 229. A further examination of the decision step 220 is necessary at this point. If at step 211 the flag F0 was set, that indicated that a negative unit value along the ∫e(t)dt axis had been reached. At step 218, if the polarity signal 74 indicates the sample value 84 is negative, the flag F0 is complemented. Since a negative value times a negative value yields a positive value, at step 220 when the microprocessor determines that the flag F0 is not set, the digital number is added to the totalized value at step 229. On the other hand, if the flag F0 was set at step 211, and at 218 the microprocessor determined that the sample value 84 was positive, the microprocessor would move directly to step 220. Since a negative value times a positive value yields a negative value, at step 220, since the flag is set the microprocessor subtracts the digital number from the totalized value in step 224. In this manner, the decision step 220 determines the sign, positive or negative, of the product of the unit value along the ∫e(t)dt axis and the sample value 84.

From step 229, the microprocessor proceeds to step 230 wherein the totalized value is compared to a digital number Y stored in the microprocessor. The digital number Y represents a quantized unit of electrical energy. If the totalized value is not greater than Y, the microprocessor returns to step 202 to again test the comparator 56. If at step 230, the totalized value is greater than Y, the microprocessor 66, at step 231, generates an output pulse 67 representative of a positive unit of energy of magnitude Y. The microprocessor then subtracts, at step 232, the value Y (which the output pulse of step 231 represented) from the totalized value. The microprocessor then returns to step 202.

Similarly, from step 224, the microprocessor 66 proceeds to step 225 wherein the totalized value is compared to −Y. If the totalized value is not less than −Y, the microprocessor returns to step 202. If at step 225, the totalized value is less than −Y, the microprocessor, at step 226, produces an output pulse 69 representative of a negative energy quantity of magnitude Y. At step 227, the value −Y (which the output pulse of step 226 represented) is subtracted from the totalized value. The microprocessor again returns to step 202 to test the comparator 56. This completes the description of the flow chart in FIG. 8.

In order to maintain a proper perspective it should be remembered that the steps shown in FIG. 8 are carried out each time an output pulse 60 or 64 is present at either output terminal 58 or 62, respectively. At nominal line voltage, approximately 50 sample values are produced during each cycle. At a nominal frequency of 60 Hz, this means that 3,000 sample values are produced per second. In other words, the steps shown in FIG. 8 are carried out approximately 3,000 times each second.

An important feature of the present invention is the production by the microprocessor 66 of the first reset signal 90 and the second reset signal 92. The reset signals 90 and 92 are composed of variable width pulses. The width of the pulses comprising both the first 90 and the second 92 reset signals is controlled by the microprocessor 66. There is a one to one correspondence between each pulse of the first reset signal 90 and each pulse 60 produced at the output terminal 58 of the comparator 56. Each pulse 60 is produced in response to the condition when the instantaneous magnitude of the integral signal 54 equals the magnitude of the fixed positive reference potential. This is illustrated in FIG. 9.

In FIG. 9 the integral signal 54 begins at time T0 at the initial value of one half Vref. At time T1, the integral signal 54 equals the fixed positive reference potential Vref indicating that a positive unit value along the ∫e(t)dt axis has been reached. At time T1 the microprocessor 66 produces a pulse of the first reset signal 90. This pulse maintains the switch 185 in the closed position for a sufficient time to allow the reset current 95 to remove the charge accumulated by the capacitor 104 from time T0 to time T1. If the value of the capacitor 104 has not changed the capacitor will be reset to its initial condition and the integral signal 54 will be returned to a voltage level of one half Vref. If the value of the capacitor 104 has changed the integral signal will be returned to a higher or lower voltage level because of the change. However, the new voltage level will compensate for the change in value of the capacitor 104.

Similarly, there is a one to one correspondence between each pulse of the second reset signal 92 and each pulse 64 produced at the output terminal 62 of the comparator 56. Each pulse 64 is produced in response to the condition when the instantaneous magnitude of the integral signal 54 equals ground potential. This is illustrated in FIG. 9. In FIG. 9 the integral signal 54 has the value of one half Vref at time T2. At time T3 the integral signal 54 equals ground potential indicating that a negative unit value along the ∫e(t)dt axis has been reached. At time T3 the microprocessor 66 produces a pulse of the second reset signal 92. This pulse maintains the switch 187 in the closed position for a sufficient time to allow the reset current 95 to deliver a charge to the capacitor 104 equal to the charge lost by the capacitor from time T2 to time T3. If the value of the capacitor 104 has not changed the integral signal will be returned to one half Vref. If the value of the capacitor has changed the integral signal 54 will be returned to a higher or lower voltage level because of the charge. However, the new voltage level will compensate for the change in value of the capacitor 104.

Another important feature of the present invention is the introduction of dither. Dither is a random shift in the time domain of the integral signal 54. Dither is introduced to randomize the sampling of the second input signal V2. Dither is introduced by the microprocessor 66 each time the first input signal V1 crosses zero going positive, or once each cycle. This occurs at time T4 in FIG. 9. The duration of the pulse initiated at time T6 is increased by 5 microseconds. This increased pulse permits more charge to be removed from the capacitor 104 than was accumulated by the capacitor from time T5 to time T6. Accordingly, it takes longer to go from time T6 to time T7 than from time T5 to time T6. This is to be distinguished from the situation where the integral signal 54 is returned to a different voltage level due to a change in the value of the capacitor 104. If that was the case, the time from time T6 to time T7 would be the same as from time T5 to time T6 because the signal 54 was returned to a lower voltage level to compensate for the fact that the circuit 52 is now integrating faster.

The introduction of dither at time T6 in FIG. 9 looks very much like the situation where the value of the capacitor 104 has shifted and the integral signal 54 is being reset to a lower voltage level to compensate for the shift in the value of the capacitor. However, it must be remembered that when the integral signal 54 is reset to a different voltage level than one half Vref it is to compensate for changes in the value of the capacitor 104 and thus keep the unit values along the ∫e(t)dt axis equal. When the integral signal 54 is reset to a different voltage level than one half Vref in order to introduce dither, it is to make one of the unit values along the ∫e(t)dt axis slightly larger thus randomizing the subsequent sample values of the second input signal V2. One of the advantages of compensating for changes in the value of the capacitor 104 and then introducing dither rather than not compensating for changes in the value of the capacitor and relying on the lack of compensation to randomize sampling is that there is control of the randomization process. In the present invention the degree of randomization is controlled and is always present.

In summary, the present invention is for a meter apparatus determining the value of an AC electric energy quantity by determining the area enclosed by an indicator diagram. The invention disclosed herein may be modified by changing the input signals and the programming of the microprocessor 66 in order to calculate other electrical energy quantities. The above discussion related to the calculation of kilowatt hours is intended for purposes of illustration and not intended as a limitation. It is anticipated that additional embodiments of the present invention may be conceived that fall within the scope of the present invention.

What is claimed is:

1. A meter apparatus computing the area of an indicator diagram for determining the value of an AC electric energy quantity defined by a voltage and a current component, comprising:
    input means for producing a first input signal representative of said voltage component;
    means for integrating said first input signal for producing an integral signal;
    means for comparing the instantaneous magnitude of said integral signal to the magnitude of fixed and predetermined reference potentials;
    processing means for producing, in response to said means for comparing, signals composed of variable width pulses;
    a constant current source for resetting, in response to said width of said pulses of said signals, said means for integrating;
    a second input means producing a second input signal representative of said current component;
    means for sampling, in response to said pulses of said signals, said second input signal for producing sample values, said sample values input to said processing means, said processing means accumulating successive sample values thereby producing totalized values representative of the time integral of the product of said current component times the time integral of said voltage component, said processing means further producing, in response to said totalized values, an output signal representative of said AC electric energy quantity.

2. The meter apparatus of claim 1 wherein the reference potentials include a positive voltage potential and ground potential.

3. The meter apparatus of claim 2 wherein the means for comparing includes a first comparator producing an output pulse each time the instantaneous magnitude of the integral signal equals the magnitude of the constant positive voltage potential, and includes a second comparator producing an output pulse each time said instantaneous magnitude of said integral signal equals the ground potential.

4. The meter apparatus of claim 3 wherein the processing means produces, in response to the pulses produced by the first comparator, a first one of two reset signals, and produces, in response to the pulses produced by the second comparator, a second one of said two reset signals.

5. The meter apparatus of claim 3 wherein the processing means produces, in response to the pulses of both the first and second comparators, a sample control signal and a scaling control signal.

6. The meter apparatus of claim 4 wherein the processing means increases the width of predetermined pulses of the reset signals such that dither is introduced.

7. The meter apparatus of claim 4 including means for selectably connecting the constant current source to the means for integrating, said means includes a first switch electrically in parallel with a series combination of an inverter and a second switch, said first switch responsive to the width of the pulses of the first reset signal, said second switch responsive to the width of the pulses of the second reset signal.

8. The meter apparatus of claim 1 wherein the second input means includes a single turn primary current transformer having a first and sensing secondary winding.

9. The meter apparatus of claim 8 wherein the second input means includes an amplifier producing, in response to the first and sensing secondary winding, an analog signal proportional to the current flowing in the primary winding.

10. The meter apparatus of claim 9 wherein the second input means includes a second and compensating secondary winding producing, in response to the analog signal, a flux equal in magnitude and opposite in direction to the flux produced by the primary winding, and wherein said analog signal flowing through said compensating secondary winding is the second input signal.

11. The meter apparatus of claim 9 including means for producing, in response to the analog signal, a polarity signal indicating the polarity of the current flowing in the primary winding, said polarity signal input to the processing means.

12. The meter apparatus of claim 5 including a scaling means responsive to said scaling control signal, said scaling means having a first current path comprised of a switch in series with a resistor, and a second current path comprised of a switch in series with a resistor, said first current path electrically in parallel with said second current path.

13. The meter apparatus of claim 12 wherein the resistance values of the resistors varies by a factor of eight.

14. The meter apparatus of claim 12 wherein the switch of the first current path is responsive to the scaling control signal, and wherein the switch of the second current path is responsive to the inverse of said scaling control signal.

15. The meter apparatus of claim 11 including a means for rectifying having a rectifier circuit in series with a switch, said switch responsive to the inverse of the polarity signal such that only one polarity of the second input signal is applied to said rectifier circuit, and includes a bypass conductor having a switch responsive to said polarity signal such that the other polarity of said second input signal bypasses said rectifier circuit.

16. The meter apparatus of claim 5 wherein the means for sampling includes a switch, responsive to the sample control signal, in series with a capacitor, said capacitor producing the sample value.

17. The meter apparatus of claim 1 wherein the processing means produces, in response to each sample value, a digital number.

18. The meter apparatus of claim 17 wherein the processing means accumulates successive digital numbers thereby producing the totalized values.

19. The meter apparatus of claim 17 including means for inputting the sample values to the processing means, said inputting means includes a digital-to-analog converter responsive to the ditigal number in the processing means, and a comparator for producing, in response to both the means for sampling and said digital-to-analog converter, a signal updating said digital number in said processing means until said digital number equals the sample value.

20. The meter apparatus of claim 19 wherein the bits comprising the digital number are sequentially updated beginning with the most significant bit.

21. A meter apparatus computing the area of an indicator diagram for determining the value of an AC electric energy quantity defined by a voltage and a current component, comprising: input means for producing a first input signal representative of said voltage component; means for integrating said first input signal and producing an integral signal; means for comparing the instantaneous magnitude of said integral signal to the magnitude of fixed and predetermined reference potentials; processing means for producing, in response to said means for comparing, two reset signals each composed of variable width pulses, a sample control signal, and a scaling control signal; a constant current source; means for selectably connecting, in response to said width of said pulses of said reset signals, said means for integrating to said constant current source; input means for producing a second input signal representative of said current component and a polarity signal indicating the polarity of said current component; a scaling means for adjusting, in response to said scaling control signal, the magnitude of said second input signal; means for rectifying, in response to said polarity signal and said adjusted second input signal, for producing a rectified signal; means for sampling, in response to said sample control signal and said rectified signal, for producing sample values; and means for inputting said sample values to said processing means, said processing means accumulating successive sample values thereby producing totalized values representative of the time integral of the product of said current component times the time integral of said voltage component, said processing means further producing, in response to said totalized value, an output signal representative of said AC electric energy quantity.

* * * * *